United States Patent
Melas

(10) Patent No.: US 7,341,628 B2
(45) Date of Patent: Mar. 11, 2008

(54) METHOD TO REDUCE CRYSTAL DEFECTS PARTICULARLY IN GROUP III-NITRIDE LAYERS AND SUBSTRATES

(76) Inventor: Andreas A. Melas, 3 Brittany La., Lincolnshire, IL (US) 60069

( * ) Notice: Subject to any disclaimer, the term of this patent is extended or adjusted under 35 U.S.C. 154(b) by 143 days.

(21) Appl. No.: 11/014,304

(22) Filed: Dec. 16, 2004

(65) Prior Publication Data

US 2005/0136627 A1    Jun. 23, 2005

Related U.S. Application Data

(60) Provisional application No. 60/531,001, filed on Dec. 19, 2003.

(51) Int. Cl.
*C30B 33/00* (2006.01)

(52) U.S. Cl. .................. 117/3; 117/2; 117/4; 117/7; 117/84; 117/88; 117/92; 117/94; 117/98; 117/103; 117/107; 117/108; 117/904; 117/905; 117/952

(58) Field of Classification Search ............ 117/2, 117/3, 4, 7, 84, 88, 92, 94, 98, 103, 107, 108, 117/904, 905, 952

See application file for complete search history.

(56) References Cited

U.S. PATENT DOCUMENTS

| | | | | |
|---|---|---|---|---|
| 4,151,008 A | * | 4/1979 | Kirkpatrick | 438/799 |
| 4,154,625 A | * | 5/1979 | Golovchenko et al. | 438/45 |
| 6,358,766 B1 | * | 3/2002 | Kasahara | 438/30 |
| 2002/0164852 A1 | * | 11/2002 | Forbes et al. | 438/240 |

OTHER PUBLICATIONS

Patent Abstracts of Japan. English Abstract of JP 61-251599 (1986).*
Geppert, L., "The Great Gallium Nitride Gamble", IEEE Spectrum, Jan. 2004, pp. 52-59.
Tan, H.,H., et.al., " Annealing of ion implanted gallium nitride", Applied Physics Letters, V. 72, No. 10, pp. 1190-1192, 1998.

* cited by examiner

*Primary Examiner*—Yogendra Gupta
*Assistant Examiner*—Mathew J. Song

(57) ABSTRACT

Gallium Nitride layers grown as single crystals by epitaxy such as Hydride Vapor Phase Epitaxy (HVPE) contain large numbers of crystal defects such as hexagonal pits, which limit the yield and performance of opto- and electronic devices. In this method, the Gallium Nitride layer is first coated with an Aluminum layer of approximate thickness of 0.1 microns. Next, Nitrogen is ion implanted through the Aluminum layer so as to occupy mostly the top 0.1 to 0.5 microns of the Gallium Nitride layer. Finally, through a pulsed directed energy beam such as electron or photons, with a fluence of approximately 1 Joule/cm² the top approximately 0.5 microns are converted to a single crystal with reduced defect density.

14 Claims, 14 Drawing Sheets

Process Method block diagram

Step 1. Compound Semiconductor layer on a substrate

Step 2. Aluminum layer deposition on top

Step 3. Nitrogen implantation through the Aluminum layer

Step 4. Pulsed energy beam exposure

Figure 1    Process Method block diagram
Step 1. Compound Semiconductor layer
on a substrate
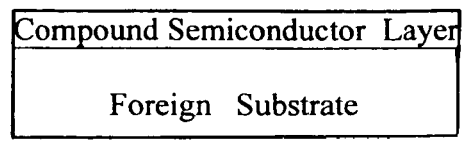
Step 2. Aluminum layer deposition on top
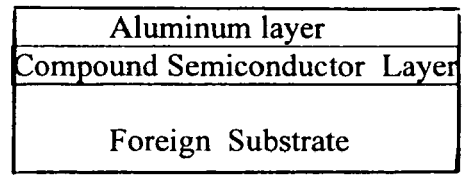
Step 3. Nitrogen implantation
through the Aluminum layer
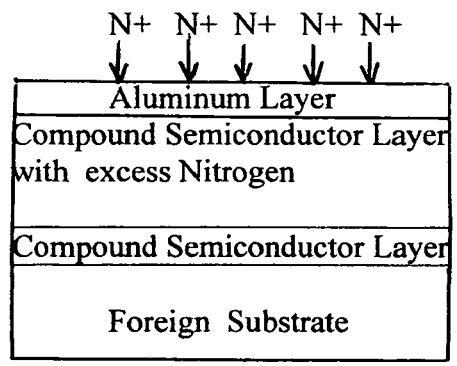
Step 4. Pulsed energy beam exposure
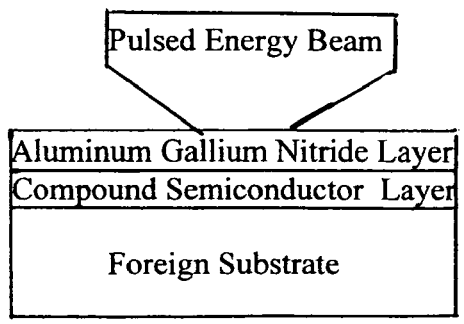

Figure 2 GaN by HVPE on Sapphire substrate, at 100X magnification
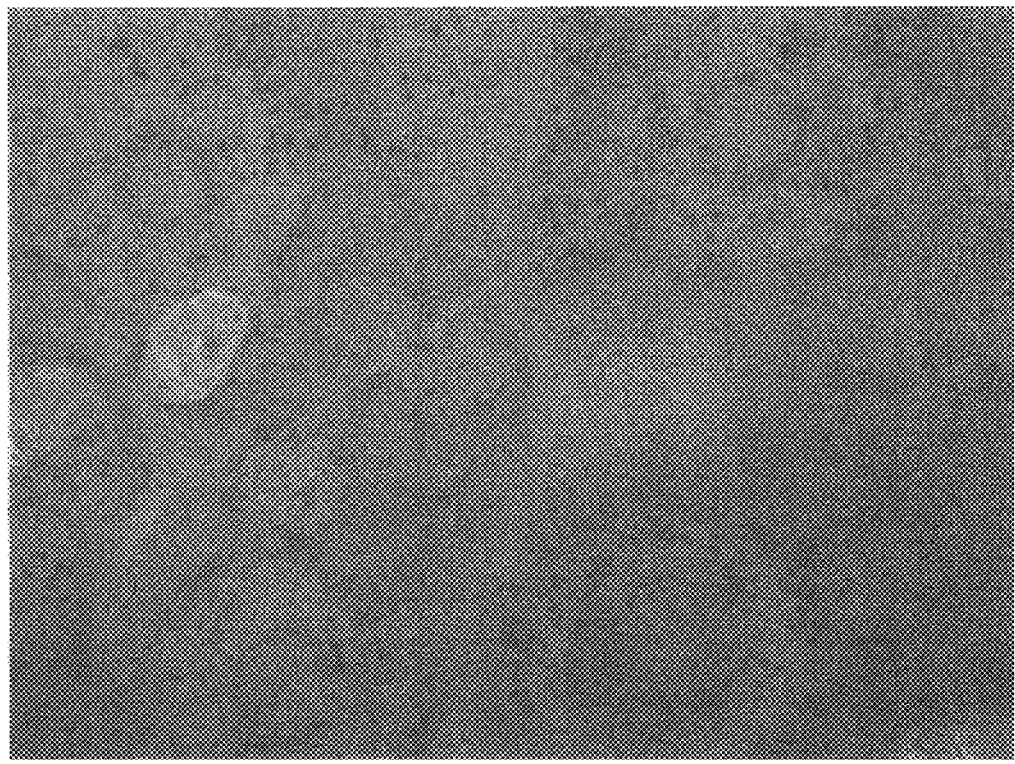

Figure 3 Sample B with 100mm Aluminum at 100X magnification

Figure 4  As Grown HVPE GaN layer, Center, 50KX magnification
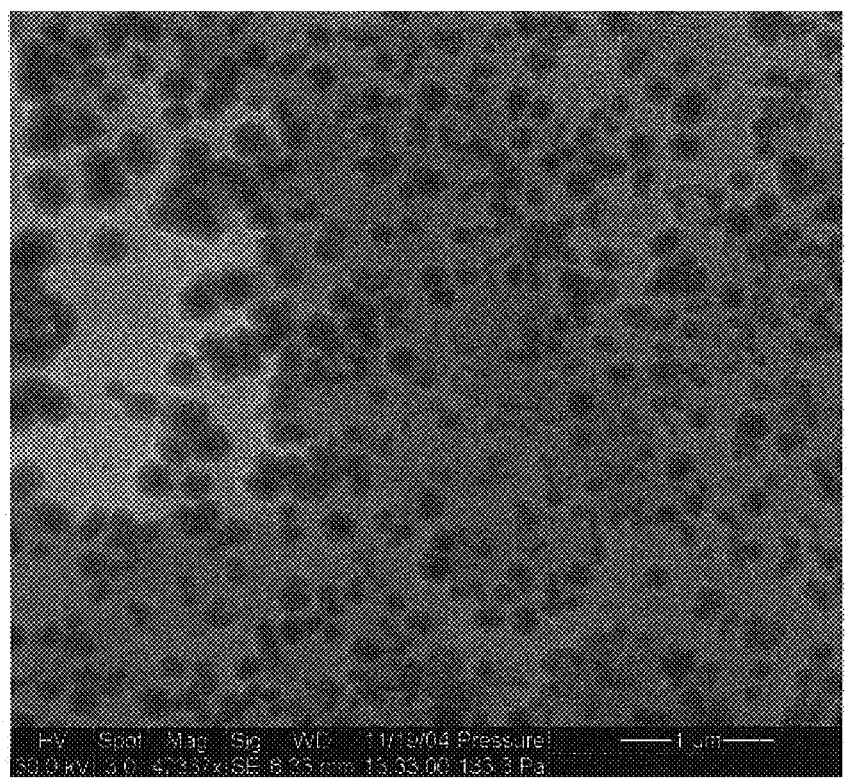

Figure 5 As grown HVPE GaN layer, hexagonal pits at 200KX magnification
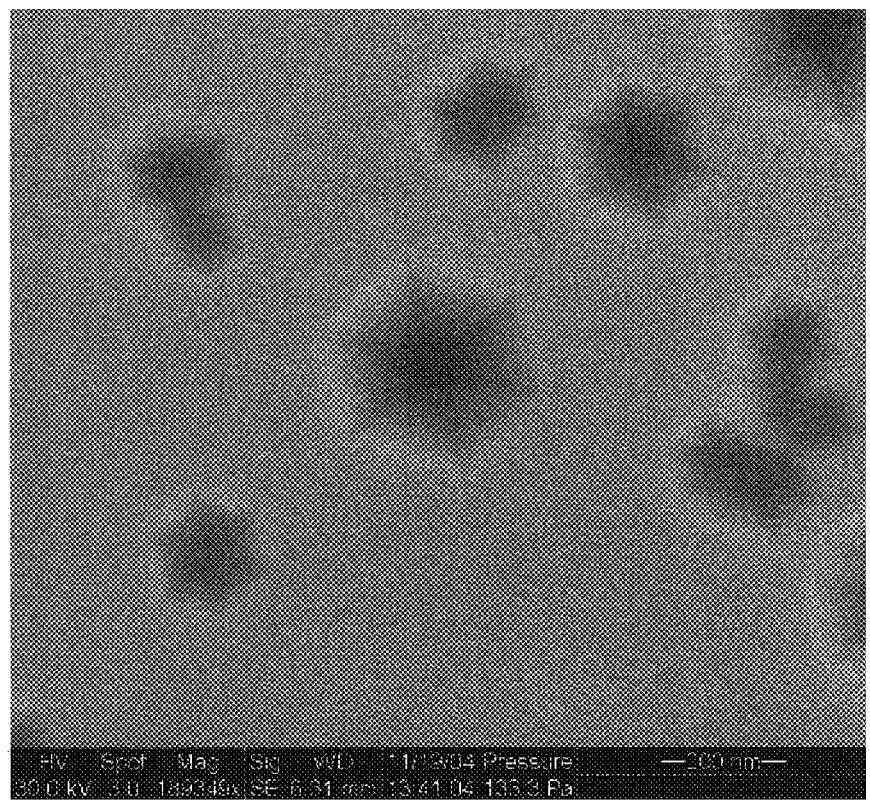

Figure 6 Sample A, with 60nm Aluminum, hexagonal pits, at 73KX magnification
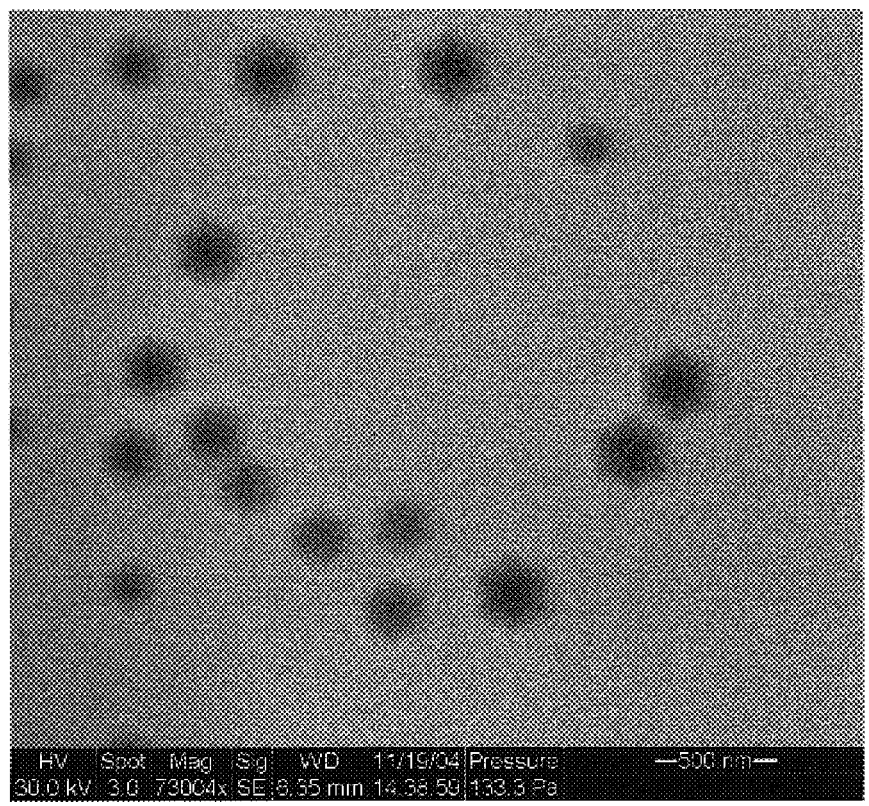

Figure 7 Sample B9/17, pulsed electron beam spot, 1893X magnification
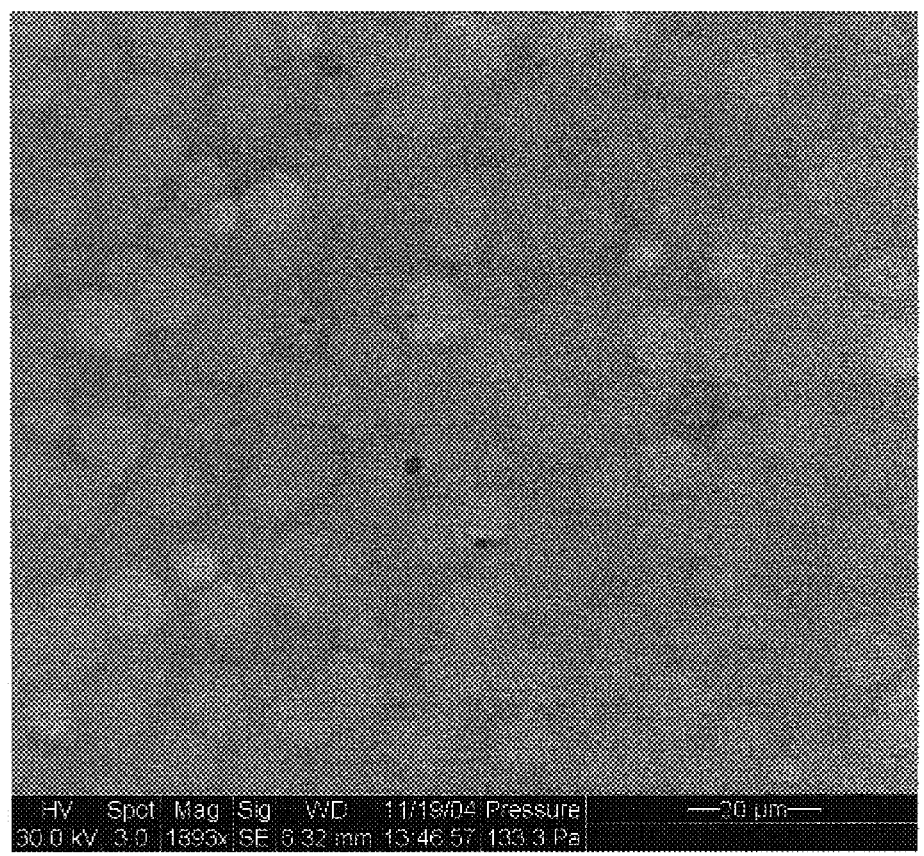

Figure 8  Sample B9/17, pulsed electron beam, 50KX magnification
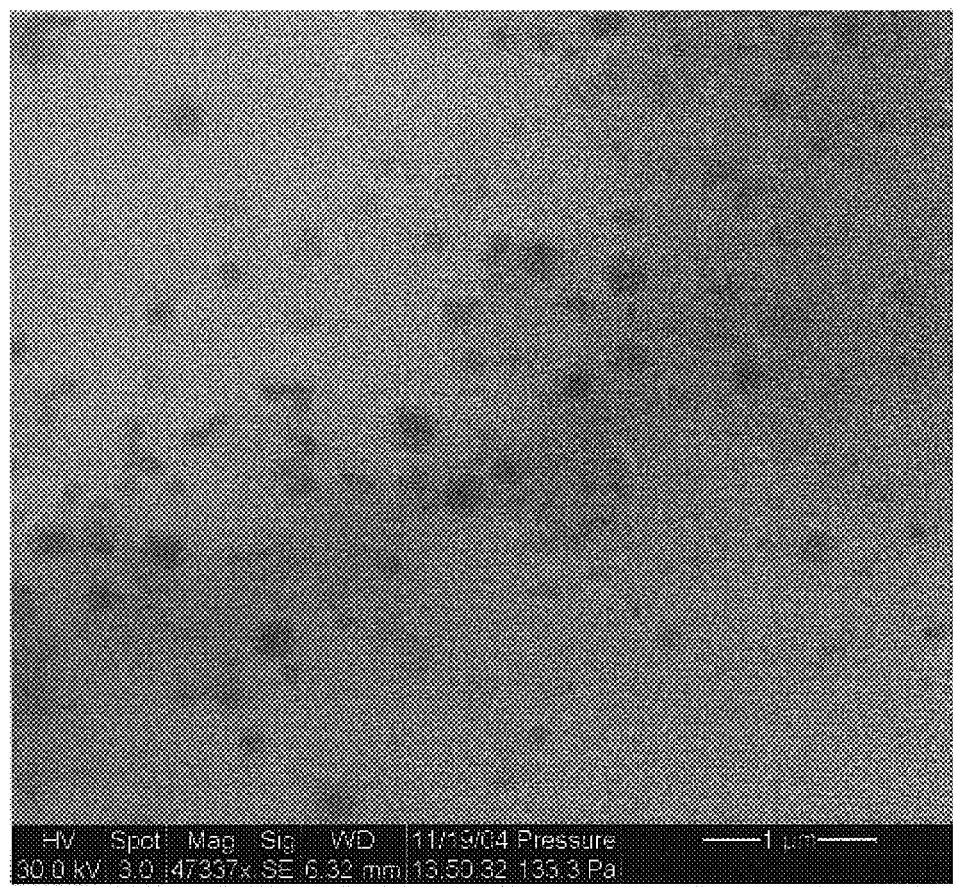

Figure 9  Sample A11/20, pulsed electron beam, 1893X magnification
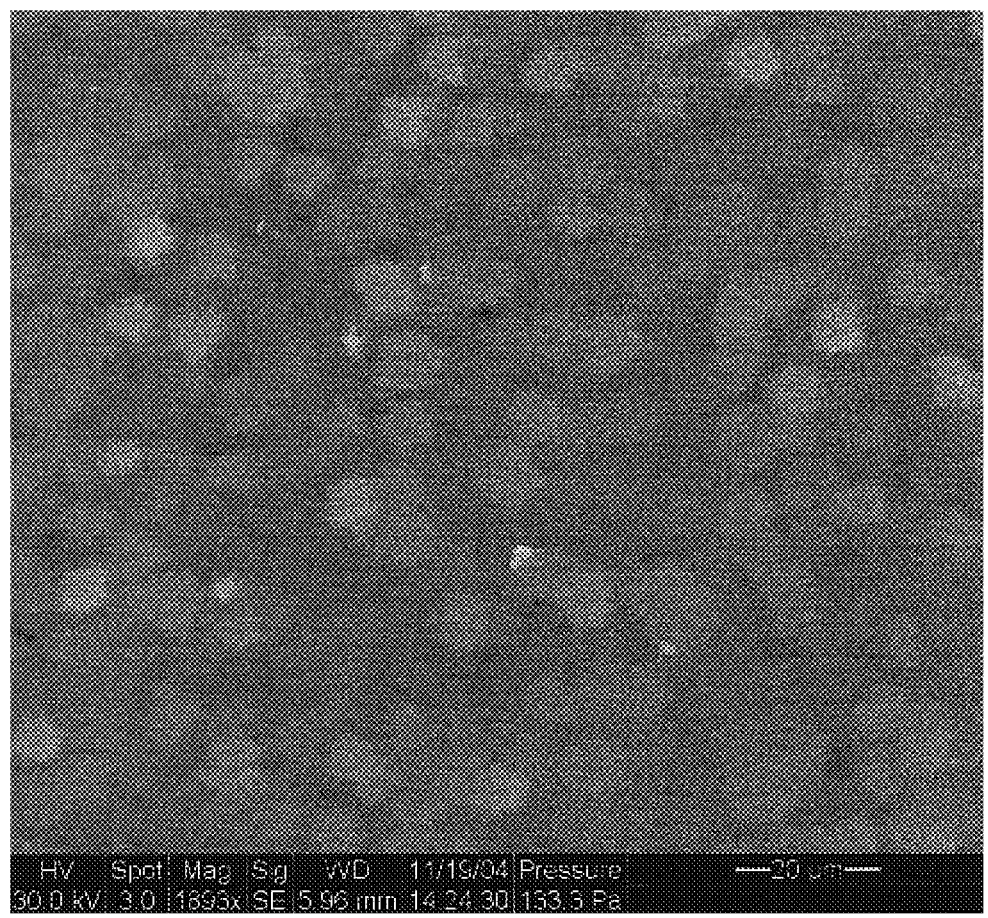

Figure 10  Sample A11/20, pulsed electron beam, 50KX magnification
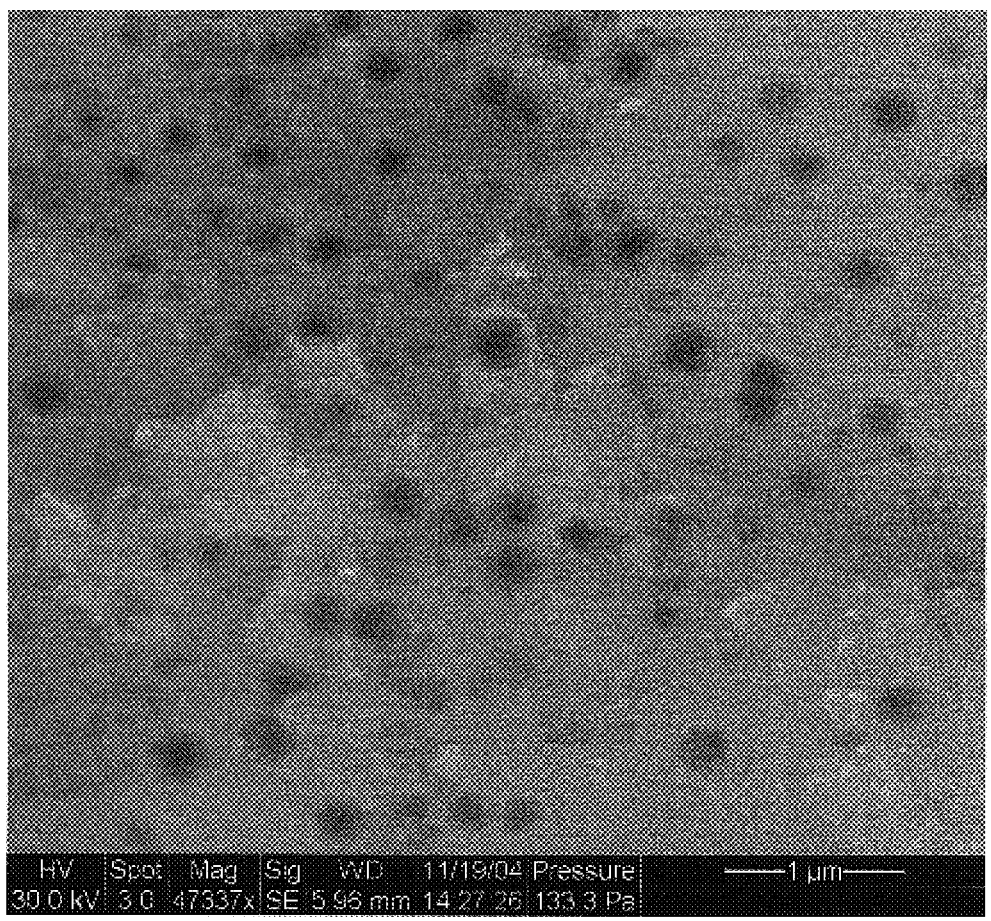

Figure 11. X Ray Diffraction, as grown HVPE GaN
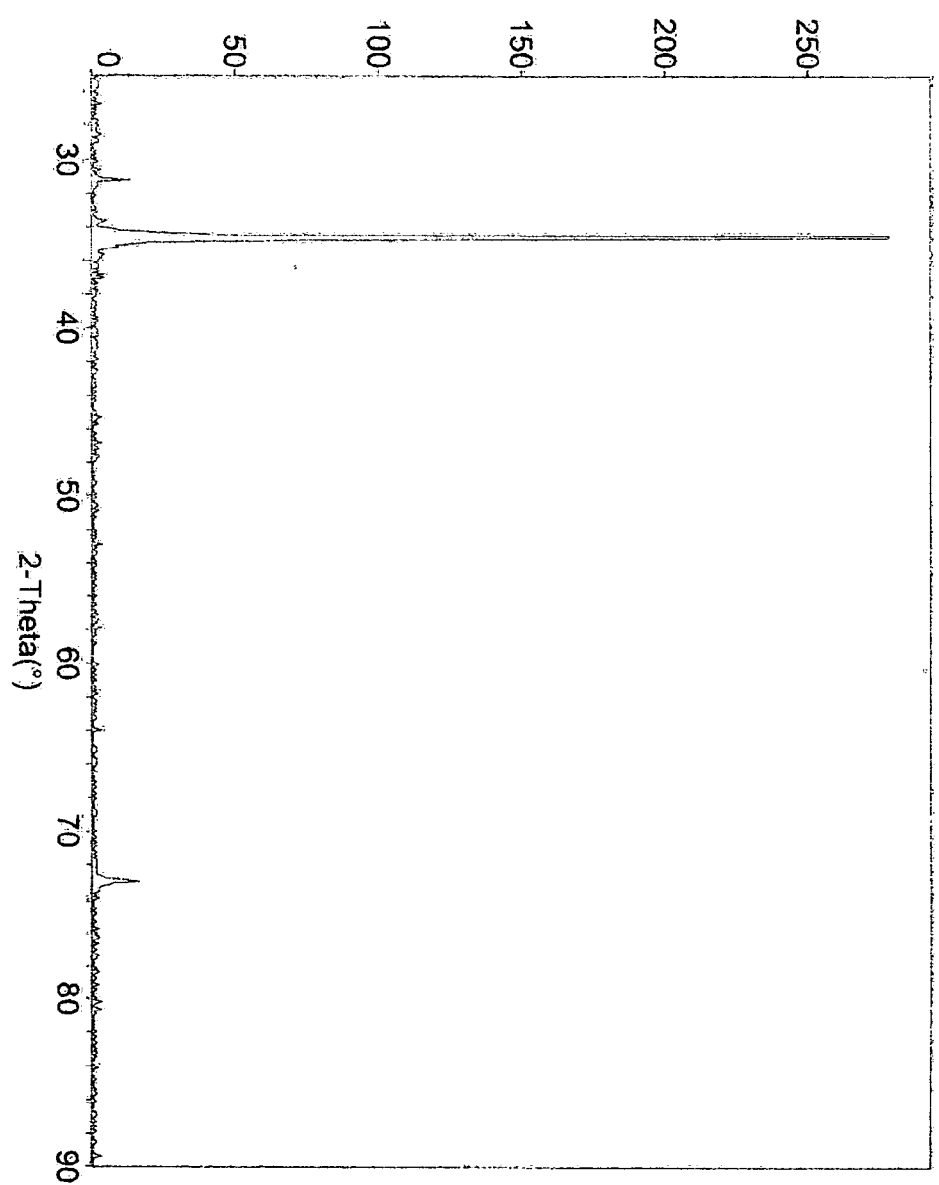

Figure 12. X Ray Diffraction, Sample A, after 60nm Aluminum deposition and $10^{+16}/cm^2$ N+ at 100KV
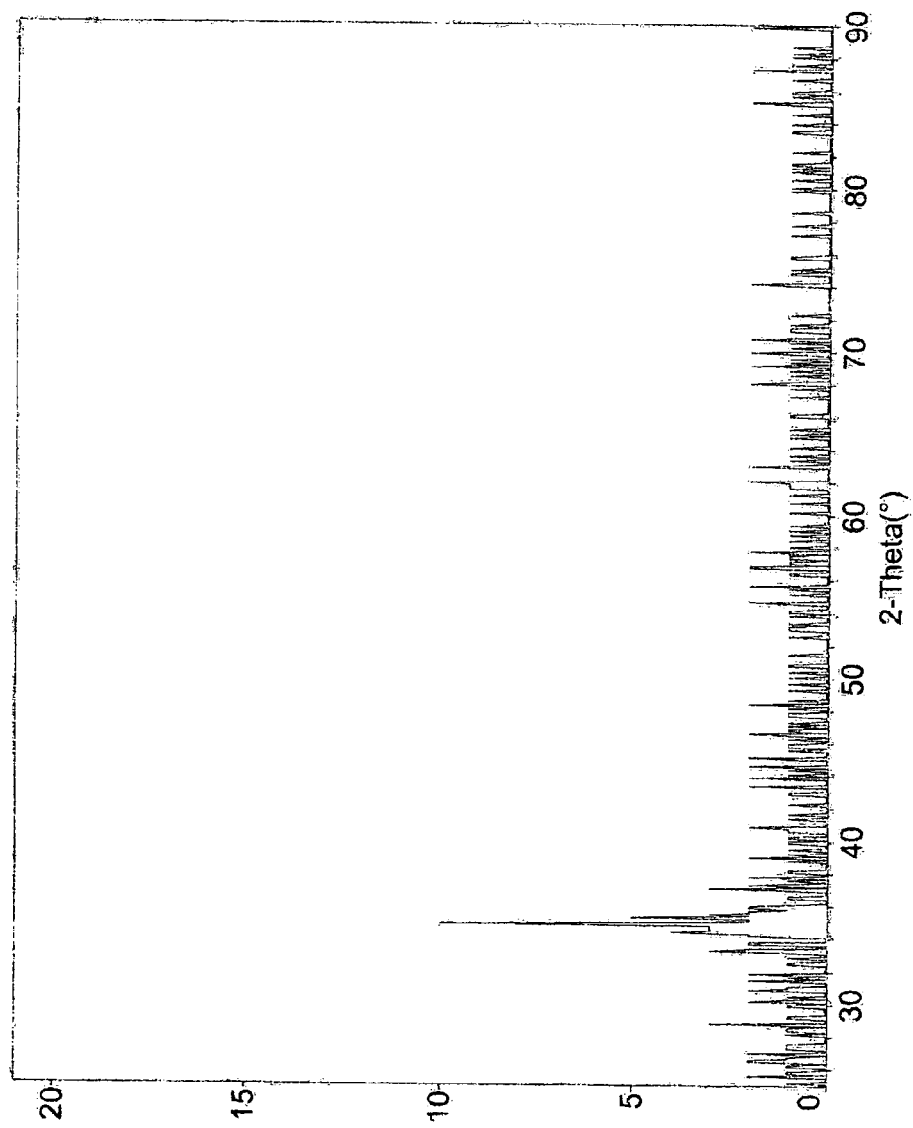

Figure 13. X Ray Diffraction, Sample B9/17, HVPE GaN, with 100nm Al, N+ implanted &, twice pulsed electron beam processed
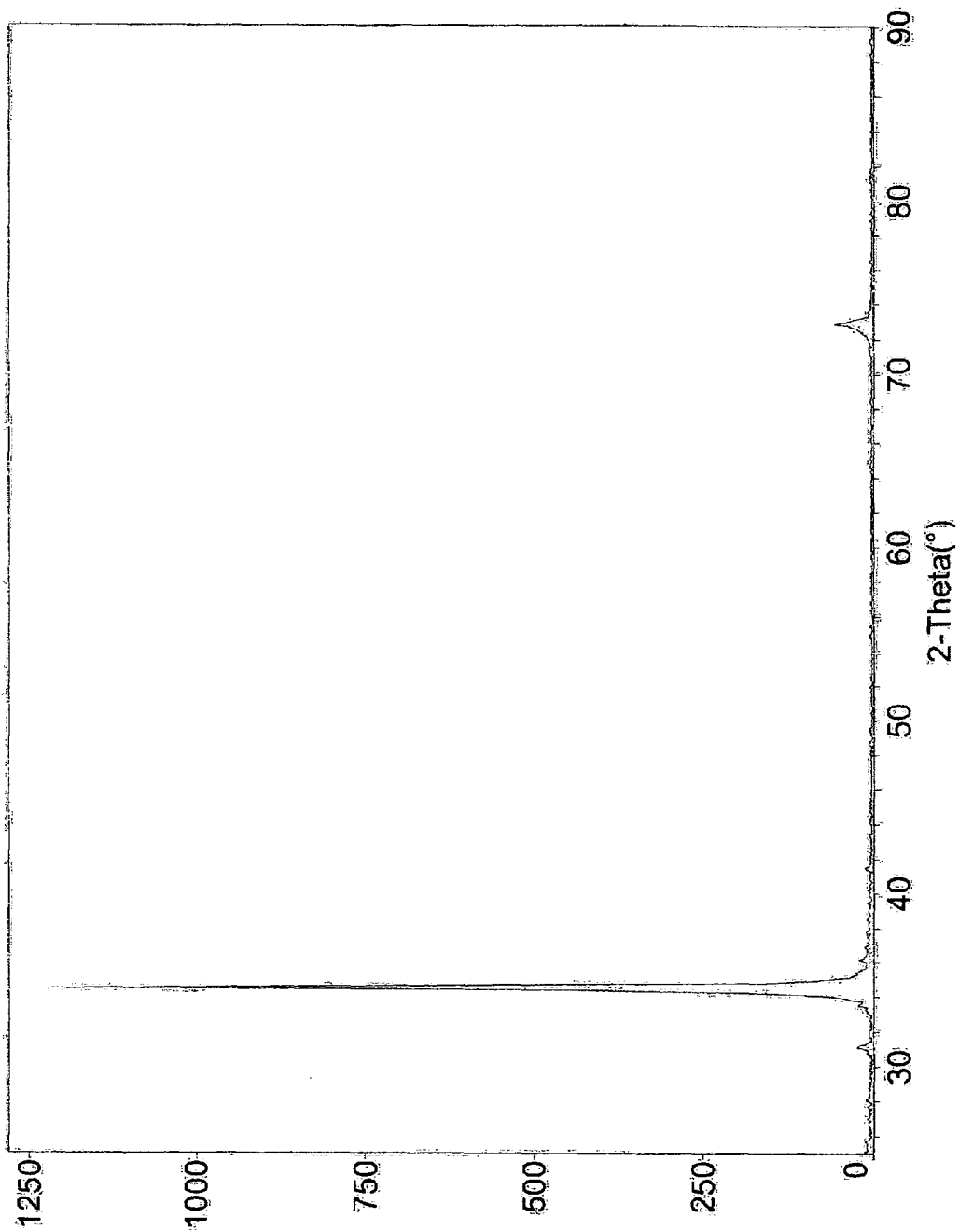

Figure 14. X Ray Diffraction, Sample A11/20, after Al evaporation, N+ implant, twice pulsed electron beam processed
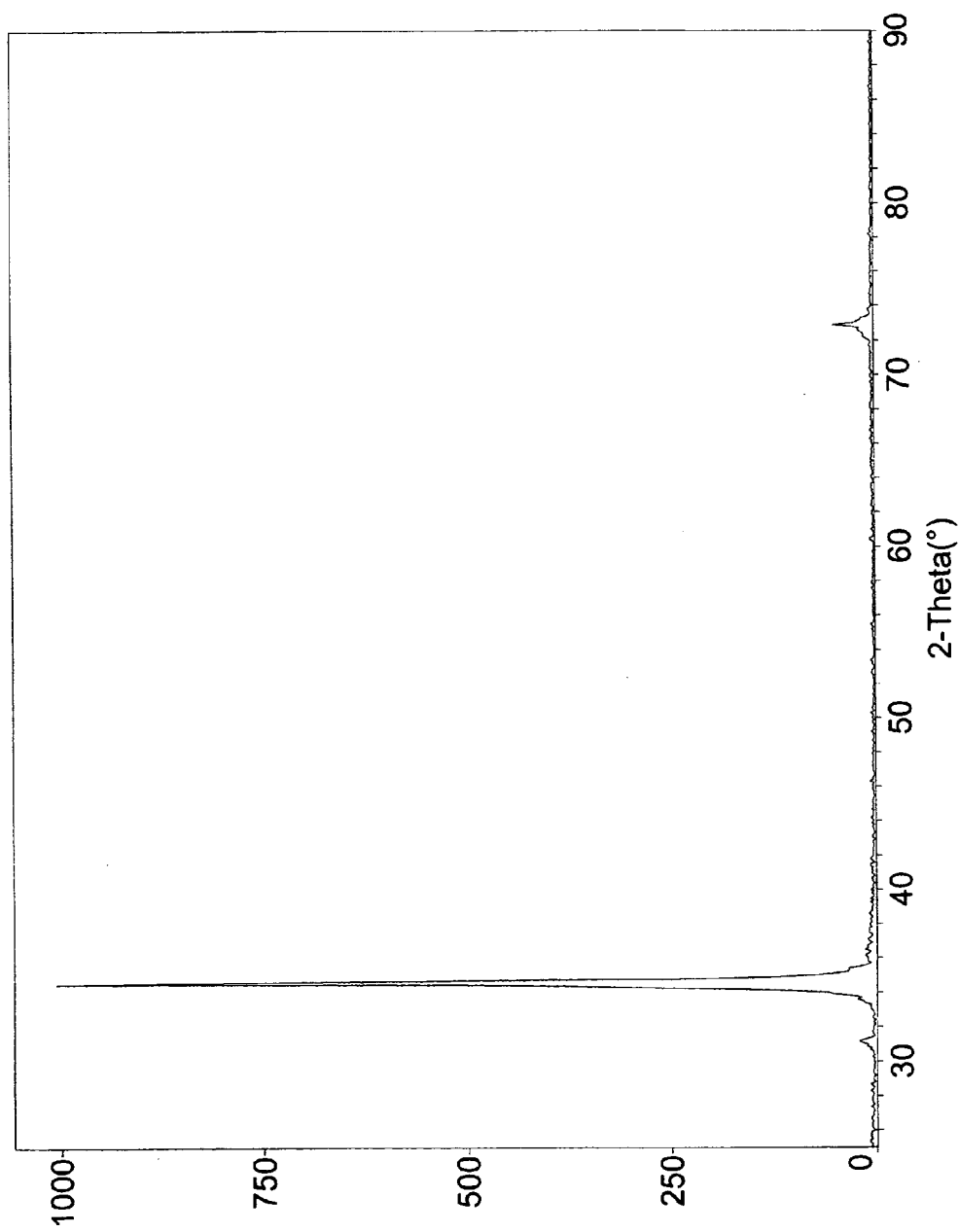

METHOD TO REDUCE CRYSTAL DEFECTS PARTICULARLY IN GROUP III-NITRIDE LAYERS AND SUBSTRATES

This Utility Application claims the priority benefit of Provisional Patent Application of Dec. 19, 2003, U.S.PTO 60/531,001.

BACKGROUND ART

Compound semiconductors of the Groups III-V and II-VI, as well as IV-IV, of the Periodic Chart of the elements, are normally synthesized at high temperatures and even very high pressures, as a boule. Typically at the melting point and standard pressure, the partial pressure of the Group V(or VI) element is high, such that special precautions are required to keep the crystalline imperfections low. For example, in the case of Gallium Arsenide (GaAs) at the melting point of 1238 C., the partial pressure of As over the liquid GaAs is approximately one atmosphere (Reference 1). This is also important in the case of epitaxial layer growth of compound semiconductors, where typical temperatures of 600-1050 C. are used to form many technologically important alloys and devices (Reference 2). Gallium Nitride, has a projected melting point of over 2500 C. with the Nitrogen overpressure of 10 thousand atmospheres (Reference 3).

Compound semiconductors have achieved commercial success during the past twenty years in high brightness Light Emitting Diodes (L.E.D's), for lighting, high performance lasers for optical fiber applications, high efficiency solar cells for satellite power, high speed transistors (in particular Hetero Bipolar Transistors) for cell telephones and other electronic and optoelectronic devices.

Blue LED's and lasers are of particular importance to not only to complete the optical spectrum but for very high density D.V.D and other optical storage applications. A particularly difficult problem for these materials relates to the substrate necessary to grow thin layers that comprise the laser, L.E.D or other electronic or optoelectronic device (Reference 4). The substrate performs several functions from providing the mechanical support, to thermal management, to allowing epitaxy to take place through its crystal structure and dimensions, to being either electrically active through impurity doping or insulating again possibly through impurity doping. Group III-Nitride substrates are the ideal materials for homoepitaxy of these materials. It is known that the growth of large (over a few mm in diameter) single crystal substrates, is extraordinarily difficult to achieve compared to GaAs or InP, for example, which are commercially available to 150 mm Outside Diameter (OD).

This application, in part, relates to one currently available growth process which produces free-standing GaN substrates and is called Hydride Vapor Phase Epitaxy or HVPE (Reference 5). In this process, a sacrificial substrate such as Sapphire, is used to deposit GaN or AlN or their alloys. Inside the apparatus, Group V source elements are carried into a heated zone by using the Group V Hydrides, while for the Group III, a mixture of Hydrogen Chloride in Hydrogen is passed over the Group III metal (e.g Gallium or Aluminum). This process can produce a 100 micron thick substrate in about an hour and easily as large as 75 mm in OD (Reference 5). Typically this type of grown GaN layer contains a very large number of crystalline defects (dislocations) due to the lattice and thermal mismatch. These are seen by a microscope and also revealed through acid etching, as pits, hence, Etch Pit Density (EPD). In this case, the EPD is in the $10^8$ to $10^{10}$ per cm$^2$ or even higher.

Ion implantation into a compound semiconductor crystal material is well known that levels in the $10^{+16}$/cm$^2$ range and higher will result in an amorphous phase (Reference 6). This amorphous phase will recrystallize into a polycrystalline material at annealing temperatures below 1100 C. It is necessary to anneal out the implantation damage at temperatures exceeding two thirds of the melting point of GaN which is 2518 C. (Reference 7).

Light energy transfer techniques such as from a flash lamp do not produce a fast enough rise in the substrate temperature and are limited to the top temperatures they can achieve to about 1200 C., which is not sufficient to anneal out ion implantation damage of compound semiconductor materials. Directed energy beams such as Pulsed electron beams were used in the past to anneal ion implantation damage in Silicon wafers as large as 100 mm OD. The pulsed electron beam, typically of 0.1 microseconds in duration, produced by an electron gun or a capacitor discharge, is accelerated through a 100 KV field and directed at an optimized angle on the substrate. Alternatively, a pulsed laser, such as a Neodymium pumped YAG laser, is also used. The electron beam total is in the range of 800 to 1000 Amperes and the electrons acquire approximately 10 KeV energy. The pulsed electron beam as above melts the Silicon wafer surface at 1410 C. and the crystallinity of the top micron or so is repaired.

In the case of compound semiconductor materials, a directed energy beam on a non protected surface will result in worse crystallinity due to decomposition.

SUMMARY OF THE INVENTION

A method of improving the crystal quality of a Group III Nitride compound semiconductor layer epitaxially grown on a lattice mismatched substrate. The method improvement wherein comprises of: (a) the reduction of surface defects such as hexagonal pits, (b) increase over the as deposited Group III Nitride layer x ray diffraction height and (c) increase in the crystallite size from the as deposited size. The method comprises of the following:

A. Provide said Group III Nitride compound semiconductor epitaxial layer and said layer comprises a top surface;

B. Place said layer of said Group III Nitride compound semiconductor material into an electron beam metal deposition tool and deposit a layer of said Group III metal component upon said top surface;

C. Place said layer of said Group III Nitride compound semiconductor with said deposited layer of said Group III metal component into an ion implantation tool and implant said Nitrogen component into said layers;

D. Place said layer of said Group III Nitride compound semiconductor with said deposited Group III metal layer and said implanted Nitrogen component into a directed pulsed electron beam tool and expose said layers to said pulsed electron beam.

Additionally:

The method above A-D wherein said Group III Nitride compound semiconductor layer is deposited on a sapphire substrate.

The method above A-D wherein said Group III Nitride compound semiconductor layer comprises Gallium Nitride.

The method above A-D, wherein said compound semiconductor layer is deposited by an epitaxial deposition method selected from a group consisting of Hydride Vapor Phase Epitaxy, (HVPE), Metal Organic Vapor Phase Epitaxy (MOVPE), Molecular Beam Epitaxy (MBE) or similar technologies.

The method above A-D wherein said Group III metal component layer comprises Aluminum of approximate thickness 0.1 micrometers.

The method above A-D wherein said Nitrogen ions are implanted at a dose at or below $5\text{expo}^{+16}/\text{cm}^2$ so that the Aluminum layer is largely intact in all its properties.

The method above A-D wherein the energy of said implanted Nitrogen component is selected to be sufficient so as to go through said deposited Group III metal component layer and the maximum implanted Nitrogen concentration is inside the Group III compound semiconductor layer below The method above A-D wherein the amount of said implanted Nitrogen is selected to be sufficient to provide an excess of not yet reacted Nitrogen component into said compound semiconductor layer.

with: The method above A-D wherein said exposing of said layers to said pulsed electron beam occurs under a background gas pressure and wherein said gas comprises Nitrogen or Ammonia gas.

General Comments Regarding Process Block Diagram

A. The method has three process steps shown as step 2-4. In each of step 2-4, not only is the method detailed but also the end result is shown.

B. The thickness of the layers is not drawn to scale.

C. In Step 4, the Aluminum in Aluminum Gallium Nitride is put in () to indicate that Aluminum is a minor (1 atomic percent or less) component.

D. Gallium Nitride refers not only to Gallium Nitride but also to Group III Nitrides, in the AlGaInN material system.

LIST OF FIGURES

FIG. 1. Process Method block diagram.

FIG. 2. GaN by HVPE on Sapphire substrate, at 100× magnification.

FIG. 3. Sample B with 100 nm Aluminum at 100× magnification.

FIG. 4. As Grown HVPE GaN layer, Center, 50K× magnification.

FIG. 5. As grown HVPE GaN layer, hexagonal pits at 200K× magnification.

FIG. 6. Sample A, with 60 nm Aluminum, hexagonal pits, at 73K× magnification.

FIG. 7. Sample B9/17, pulsed electron beam spot, 1893× magnification.

FIG. 8. Sample B9/17, pulsed electron beam, 50K× magnification.

FIG. 9. Sample A11/20, pulsed electron beam, 1893× magnification.

FIG. 10. Sample A11/20, pulsed electron beam, 50K× magnification.

FIG. 11. X Ray Diffraction, as grown HVPE GaN.

FIG. 12. X Ray Diffraction, Sample A, after 60 nm Aluminum deposition and $10^{+16}/\text{cm}^2$ N+ at 100 KV.

FIG. 13. X Ray Diffraction, Sample B9/17, HVPE GaN, with 100 nm Al, N+ implanted & twice pulsed electron beam processed.

FIG. 14. X Ray Diffraction, Sample A11/20, after Al evaporation, N+ implant, twice pulsed electron beam processed.

DESCRIPTION OF THE INVENTION

Experimental

The pulsed electron beam process requires a conductive surface in order to be highly uniform. This is done by evaporating a metal such as Aluminum or other Group III metal or a noble metal in the range of a ten to a thousand, or more, nanometers. This also provides the basis to improve the crystallinity of a HVPE GaN substrate.

A half of a 50 mm O.D HVPE GaN epitaxial layer grown on a polished sapphire wafer was used. The half wafer was checked by optical microscopy (FIGS. 2,3), Scanning Electron Microscopy (FIG. 4) and X Ray Diffraction (FIG. 11). It was diced into four pieces two of which became Samples A and B below for the processing experiments. The other two pieces served as controls.

It can be seen by X Ray Diffraction, that the grown layer is epitaxial as a 0002 plane at 36.6 2 theta degrees (FIG. 11). This epitaxial layer also shows hexagonal pits of 200-300 nanometers in diameter estimated by the SEM in the $10^{19}/\text{cm}^2$ range. (FIGS. 5,6) and the crystallite size is in the 1 to 3 micrometers in diameter.

Process I. Pulsed Electron Beam Through Deposited Aluminum Layer:

1. Deposit a high purity layer of Aluminum metal in the range of 0.06 as Sample A (FIG. 6) and 0.1 micrometers thick, Sample B. This was deposited by electron beam evaporation at a background pressure of $8\times10^{-6}$ torr to ensure minimum contamination. Aluminum deposition can also be done by a Chemical Vapor Deposition technique. The use of Aluminum is significant not only because it is a Group III metal and highly conductive but also because a AlGaN alloy can be produced. It is known that the crystal structure and lattice constant of AlN is very similar to GaN and these two are completely miscible in all proportions. Additionally, AlN can be formed after Step 2 below which is an encapsulating layer.

2. Implant Nitrogen ions using a Varian model DF3000 ion implantation system. The $^{14}\text{N}^+$ beam was derived from Nitrogen gas in a hot filament ion source and analyzed magnetically. The N+ ions were accelerated through a 100 KV potential and then scanned across the sample electrostatically. The 100 KV is chosen to allow the majority of Nitrogen ions to go through the Aluminum layer and occupy the top 0.2 microns of the Gallium Nitride layer. Additionally, as the Nitrogen is implanted through the Aluminum layer an Aluminum Nitride layer is formed at the relatively high dose used of $5\times10^{+16}/\text{cm}^2$. The samples marked A and B were not cooled. Above $10^{+16}/\text{cm}^2$ an amorphous and porous layer forms (Reference 6)_which is normally highly undesirable because can not be annealed completely back to single crystal. The X Ray Diffraction shows a much reduced and wider 0002 plane peak confirming an amorphous layer was formed (FIG. 12) with very low peak intensity.

3. Next a pulsed electron beam generated by Electron Gun, such as in a Neocera Pulsed Electron Beam deposition system modified by defocusing the electron beam used (Reference 8). Irradiation of each of the samples is made with single pulse of energetic electrons, at room temperature. The sample is attached to a non-grounded metallic holder. The distance between the electron source and the sample is 15 mm and the average beam diameter on sample surface is 3-4 mm. The samples A and B were further diced into four pieces each to allow for a control as well as different fluence levels. The electric field of 9 to 20 KV is used, and up to 1KA, only limited by the power supply and with a typical pulse width of 150 nanoseconds, resulting in an energy fluence from 0.1 to 1 Joules per $cm^2$ (Table 1). The electron beam pulse was repeated for two samples A11/20 and B9/17 as necessary to optimize the results. The samples now show a recrystalized area surrounded by the metallized front of the wafers. The twice pulsed samples A11/20 and B9/17 show a further improvement in peak height and peak half width as seen in Table 2.

TABLE 1

Pulsed Electron Beam experiments summary

| Sample | Source Voltage, kV | Peak beam current, Amperes | Average electron energy, KeV | Pulse duration, nanoseconds | Pressure, mTorr |
|---|---|---|---|---|---|
| A9/17 | 9 and 17 | 700 | 8.5 | 150 | 9.5 |
| B9/17 | 9 and 17 | 700 | 8.5 | 150 | 9.5 |
| A11/20 | 11 and 20 | 850 | 10 | 150 | 9.0 |
| B11/20 | 11 and 20 | 850 | 10 | 150 | 9.0 |
| A14 | 14 | 700 | 8.5 | 150 | 9.5 |
| B14 | 14 | 850 | 10 | 150 | 9.0 |

4. Next, X Ray Diffraction is used to check the affects of the processing. A Rigaku DMAX"A" instrument is used. The radiation is Cu K alpha, Nickel filtered, the anode operating at 20 KV and 2 mA. The scans are made from 20 to 90 2 theta degrees. The only major peak is the 0002 at 36.6, 2 theta degrees, confirming the strong epitaxy. After N+ implantation the peak height decreases significantly, which the recovers at the varous fluence levels. This is summarized in Table 2. Clearly the implantation damage is relieved which confirms the very high temperature achieved. More significantly, the much increased peak height of the 0002 peak for Samples B9/17 and A11/20, indicating the improvement that can be achieved (Table 2).

5. Finally, a Hitachi S-3500N Scanning Electron Microscope is used to look at surface defects. Several magnifications were used and the 50K× is used for comparisons. The operating electron voltage is 30 KV and the instrument pressure is 133.3 Pa. Hexagonal pits form as Gallium Nitride is known to grow as pyramids and where the pyramids coalesce, a pit forms. These pits are seen by the SEM and are 200-300 nanometers across and estimated in the $10^{+9}/cm^2$ range. Significantly, after processing the pit density is clearly lower by over an order of magnitude a seen in Table 2. Additionally, the crystallite size increases to 5-10 micrometers as seen in Sample B9/17, by the SEM (FIG. 7).

TABLE 2

X Ray Diffraction and SEM summary

| Sample | History | 2Theta Degrees | Peak Height (Arbitr. Units) | FWHM Degrees | Crystal O.D(SEM) Micrometers |
|---|---|---|---|---|---|
| HVPE A | As grown 60 nm Al | 34.661 | 280 | 0.238 | 1-3 |
|  | N+ implanted | 34.661 | 10 | 0.238 | 1-3 |
| A14 | Same as A Pulsed Electron Beam One pulse | 34.593 | 387 | 0.387 |  |
| A11/20 | 60 nm Al N+ implanted Pulsed Electron beam Twice pulsed | 34.596 | 1008 | 0.312 | 5-10 |
| B14 | 100 nm Al Pulsed Electron Beam One pulse | 34.573 | 492 | 0.387 |  |
| B9/17 | 100 nm Al N+ implanted Pulsed electron beam Twice pulsed | 34.577 | 1220 | 0.271 | 5-10 |

PREFERRED EMBODIMENTS

1. This application, in part, relates to one currently available growth process which produces free-standing GaN substrates and is called Hydride Vapor Phase Epitaxy or HVPE rather than on the more common crystal growth techniques where a boule is produced under the appropriate temperature and pressure from the compound elements. Since in HVPE the layer is grown on a non GaN substrate, as it is not available in standard size, a lattice mismatched material, the crystal defects are very large in number, i.e. $10^{+8}$-$10^{+10}$ $cm^2$. The result is, must be used. In the case when epitaxy is required to grow Group III-Nitride devices such as lasers, the yields are very poor. A reduction by at least two orders of magnitude is necessary to produce commercially useful substrates of this type.

2. The use of excess Aluminum as an encapsulating layer is important in several ways. First, it is necessary to spread out the electron beam. Second it is sacrificial and can be sputtered off during N+ implantation or blown off by pulsed energy beam. Third it can be reacted out to an Aluminum Nitride or a mixed Aluminum Gallium Nitride alloy. Fourth, during the N+ implantation, the substrate may heated to about 500 C., which reduces the radiation damage. And, Fifth, the use of the Aluminum layer effectively slows down the implanted Nitrogen ions and thus the radiation damage is minimized. Aluminum is preferred over Gallium because Gallium has a very low melting point, but Aluminum is completely acceptable and preferable as explained above. The result is the new surface generated at the top of the GaN layer after processing, shows improved crystallinity as seen by Scanning Electron Microscopy and by the increased X Ray peak height of the 0002 plane (Table 2 and FIGS. 13,14). This makes the layer more suitable for higher yield of blue/green laser devices by layer deposition.

3. The use of ion implantation is standard in semiconductor technology. However, it is also well known that radiation damage due to high energy of the implantation process requires a high enough temperature to anneal out, which is estimated at ⅔ of the melting point (Reference 7). In the case of Gallium Nitride that is around 1650 Celcius. Additionally, $N^+$ implantation may result in a porous, amorphous material with gaseous inclusions due to decomposition and therefore not obvious. Even higher levels of $N^+$ implantation may result in a higher concentration of interstitial Nitrogen, which would produce a higher Nitrogen overpressure which is necessary to anneal out the defects to a greater degree but at an even greater temperature. The use of Nitrogen is then necessary to promote a chemical reaction and alloying with the existing GaN layer and deposited Aluminum and thus a novel approach.

4. Given that these compound semiconductors are sensitive and prone to decomposition at higher than ambient temperatures, any technique which can improve the EPD of grown wafers as compared to a boule, needs to be very fast, at sub microsecond length, such as the pulsed electron or laser techniques.

5. In the case of ion implantation damage, a directed energy beam such as a pulsed electron beam has been demonstrated to anneal out the damage, at the appropriate energy level or fluence, as energy per $cm^2$. The voltage used as well as the energy fluence, in Joules per $cm^2$, affect the charachteristics of the beam such as surface penetration. Additionally, the beam must be controlled to be as uniform as possible to achieve uniformity of heating and thus crystallinity repair. The fluence required for this application is in the order of 1 Joule per $cm^2$.

6. When the pulsed electron beam is highly focused, such as approximately 1 $mm^2$, the highly focused beam can lead to very rapid and localized temperature rise and thus to vaporization and consequently deposition of the target material on a substrate (Reference 8). In this patent application, a defocused beam of the necessary fluence, is required to produce annealing and reaction to relieve the radiation damage on a larger scale and be of commercial value. The result of the directed energy beam such as the pulsed electron beam is to raise the surface temperature from ambient to well over 1000 C. depending on the fluence and other factors such as energy coupling to the surface. As the surface temperature rises by the energy transfer, the Aluminum atoms from the melted Aluminum layer on the surface, into the underlying material. In this case, Aluminum, given its reactivity, can alloy with the Gallium Nitride substrate material and in the process compress the interstitial Nitrogen to very high pressure and temperature. Since the pulse is sufficiently short, decomposition does not occur and is further controlled by the capping Aluminum Nitride and Aluminum layer. The resulting AlGaN alloy as seen from Table 2, where the 2 theta is reduced and thus the lattice spacing is reduced towards that of Aluminum Nitride. This AlGaN alloy formed from the surface to some depth, is now of lower EPD as a result of filling the voids and other defects and defect annihilation by solid state diffusion, alloying and very high temperature and pressure. This is effectively a surface polishing technique as well.

7. By use of multiple directed energy pulses, the temperature rise as well as depth of Aluminum diffusion, increase. This leads to greater defect annihilation as is seen in Table 2. The crystallite size increases by several fold and the X Ray Diffraction half width decreases compared to the single pulsed layers.

While the invention has been described in terms of certain preferred embodiments, modifications obvious to with ordinary skill in the art may be made without departing from the scope of the invention.

What is claimed is:

1. A method of improving the crystal quality of a Group III Nitride compound semiconductor layer epitaxially grown on a lattice mismatched substrate comprising:

A. providing said Group III Nitride compound semiconductor epitaxial layer and said Group III Nitride compound semiconductor epitaxial layer comprises a top surface;

B. placing said layer of said Group III Nitride compound semiconductor material into an electron beam metal deposition tool and depositing a layer of Group III metal component upon said top surface;

C. placing said layer of said Group III Nitride compound semiconductor with said deposited layer of said Group III metal component into an ion implantation tool and implanting a Nitrogen component through said Group metal component layer into said Group III Nitride compound semiconductor epitaxial layer, thereby forming a Group III Nitride compound semiconductor layer with an excess of unreacted nitrogen;

D. placing said layer of said Group III Nitride compound semiconductor with said deposited Group III metal layer and said implanted Nitrogen component into a directed pulsed electron beam tool and exposing said layers to a pulsed electron beam;

wherein said Group III Nitride compound semiconductor layer after exposure to said pulsed electron beam exhibits a reduction of hexagonal pits, an increase in x ray diffraction height and an increase in the crystallite size compared to the as deposited Group III Nitride compound semiconductor layer.

2. The method of claim 1 wherein said Group III Nitride compound semiconductor layer is deposited on a sapphire substrate.

3. The method of claim 1 wherein said Group III Nitride compound semiconductor layer comprises Gallium Nitride.

4. The method of claim 1 wherein said epitaxial deposition method is selected from a group consisting of Hydride Vapor Phase Epitaxy, (HVPE), metalorganic vapor phase epitaxy (MOVPE), and molecular beam epitaxy (MBE) or similar technologies.

5. The method of claim 1 wherein said Group III metal component layer comprises Aluminum of approximate thickness 0.1 micrometers.

6. The method of claim 1 wherein said implanted of Nitrogen ions at a dose at or below $5 expo^{+16}/cm^2$ so that the Aluminum layer largely intact in all its properties.

7. The method of claim 1 wherein the energy of said implanted Nitrogen component is selected to be sufficient so as to go through said deposited Group III metal component layer and the maximum implanted Nitrogen concentration is inside the Group III compound semiconductor layer below.

8. The method of claim 1 wherein said pulsed energy beam comprises an energy to raise the surface temperature to effect crystal quality improvement of between 0.1 and 2 Joule per $cm^2$.

9. The method of claim 1 wherein said pulsed energy beam comprises of a pulse duration of less than a microsecond.

10. The method of claim 1 wherein said pulsed electron beam comprises a diameter of at least 3 mm.

11. The method of claim 1 wherein said exposing of said layers to said pulsed electron beam occurs under a background gas pressure and wherein said gas comprises Nitrogen or Ammonia gas.

12. The method of claim 1 wherein said pulsed energy beam is used more than one time sequentially.

13. The method of claim 1, wherein said pulsed energy beam is moved in a controlled manner over the entire surface of said layers.

14. The method of claim 1, wherein said pulsed electron beam is stationary and said layers are exposed to said beam by moving said layers in a controlled manner.

* * * * *